United States Patent
Weng et al.

(10) Patent No.: US 7,547,962 B2
(45) Date of Patent: Jun. 16, 2009

(54) CHIP PACKAGE WITH A RING HAVING A BUFFER GROOVE THAT SURROUNDS THE ACTIVE REGION OF A CHIP

(75) Inventors: Gwo-Liang Weng, Kaohsiung (TW); Yung-Li Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 369 days.

(21) Appl. No.: 11/642,682

(22) Filed: Dec. 21, 2006

(65) Prior Publication Data

US 2007/0222041 A1 Sep. 27, 2007

(30) Foreign Application Priority Data

Mar. 24, 2006 (TW) .............................. 95110224 A

(51) Int. Cl.
*H01L 23/02* (2006.01)
*H01L 21/00* (2006.01)
(52) U.S. Cl. .................... 257/680; 257/784; 257/787; 438/116
(58) Field of Classification Search ............ None
See application file for complete search history.

(56) References Cited

U.S. PATENT DOCUMENTS

| 6,401,545 | B1 * | 6/2002 | Monk et al. ............ 73/756 |
| 6,838,760 | B1 * | 1/2005 | Cobbley ............... 257/680 |
| 6,987,312 | B2 * | 1/2006 | Theuss ................ 257/680 |
| 7,187,067 | B2 * | 3/2007 | Weng et al. ........... 257/680 |
| 2006/0087017 | A1 * | 4/2006 | Chao et al. ............ 257/680 |

FOREIGN PATENT DOCUMENTS

JP 2001185657 A * 7/2001

* cited by examiner

*Primary Examiner*—Alonzo Chambliss
(74) *Attorney, Agent, or Firm*—Rabin & Berdo, PC.

(57) ABSTRACT

A chip package including a package substrate, a chip, several bonding wires, a flash-resisting ring and a molding compound. The package substrate includes a carrying surface and several contacts disposed on the carrying surface. The chip is disposed on the carrying surface. A surface of the chip away from the package substrate includes an active region and several bonding pads. The bonding pads are located outside the active region. The bonding wires connect the bonding pads and the contacts. The flash-resisting ring disposed on the chip is located between the bonding pads and the active region. The flash-resisting ring surrounding the active region includes at least one buffer groove. The buffer groove surrounds the active region. The molding compound disposed on the package substrate and the chip encapsulates at least the bonding pads, the contacts and the bonding wires. The molding compound exposes the active region.

6 Claims, 6 Drawing Sheets

CHIP PACKAGE WITH A RING HAVING A BUFFER GROOVE THAT SURROUNDS THE ACTIVE REGION OF A CHIP

This application claims the benefit of Taiwan application Serial No. 95110224, filed Mar. 24, 2006, the subject matter of which is incorporated herein by reference.

BACKGROUND OF THE INVENTION

1. Field of the Invention

The invention relates in general to a semiconductor device and a manufacturing process thereof, and more particularly to a chip package and a package process thereof.

2. Description of the Related Art

In the technology era, electronic apparatuses play a significant role in everyone's daily life. A chip, the core of an electronic apparatus, is electrically connected to other chips or passive devices through a carrier. For example, the electronic apparatus is a digital camera or a digital video camera. The digital camera or the digital video camera senses an image through an electro-optical device sensing the intensity of light. Furthermore, the chip in the electro-optical device is electrically connected to the carrier through several bonding wires in a package process. The bonding wires are protected from temperature, moisture and noise through the package process.

FIG. 1A is a cross-sectional view of a conventional chip package in an electro-optical device. Please referring to FIG. 1A, a conventional chip package 100 includes a package substrate 110, a chip 120, several bonding wires 130, a flash-resisting ring 140 and a molding compound 150. The package substrate 110 includes a carrying surface 112 and several contacts 114 disposed on the carrying surface 112. The chip 120 disposed on the carrying surface 112 has a surface 122 away from the package substrate 110. The surface 112 includes an active region 124 and several bonding pads 126. The bonding pads 126 are disposed outside the active region 124.

Moreover, the bonding wires 130 connect the bonding pads 126 and the contacts 114, for electrically connecting the chip 120 and the package substrate 110. The flash-resisting ring 140 is disposed on the chip 120. The flash resisting ring 140 disposed between the bonding pads 126 and the active regions 124 surrounds the active regions 124. Besides, the molding compound 150 is disposed on the package substrate 110 and the chip 120. The molding compound 150 encapsulating the bonding pads 126, the contacts 114, the bonding wires 130 and a portion of the flash-resisting ring 140 exposes the active region 124.

Please referring to FIG. 1B, FIG. 1B illustrates the chip package in FIG. 1A in a molding process. What is worth mentioning is that there is a small gap between the flash-resisting ring 140 and a second mold M2 (a first mold M1 carrying the package substrate 110) of a mold assembly M in the molding process. It is because the flash-resisting ring 140 is not contoured to fit the second mold M2. As a result, when the melted molding compound 150 is filled in a cave formed by the first mold M1 and the second mold M2 outside the chip 120, the melted molding compound 150 easily passed through this narrow gap and then overflows into the active region 124. Therefore, the active region 124 is polluted by flash.

SUMMARY OF THE INVENTION

The invention is directed to a chip package with a buffer groove formed on a flash-resisting ring. As a result, an active region of the chip is protected from flash.

The invention is also directed to a package process of a chip package. A buffer groove of a flash-resisting ring contains overflowing molding compound in a molding process, so that an active region of the chip is protected from flash.

According to the present invention, a chip package including a package substrate, a chip, several bonding wires, a flash-resisting ring and a molding compound is provided. The package substrate includes a carrying surface and several contacts disposed on the carrying surface. The chip is disposed on the carrying surface. A surface of the chip away from the package substrate includes an active region and several bonding pads. The bonding pads are located outside the active region. The bonding wires connect the bonding pads and the contacts. The flash-resisting ring disposed on the chip surrounds the active region. The flash-resisting ring is located between the bonding pads and the active region. At least a buffer groove is formed on the flash-resisting ring surrounding the active region. The molding compound disposed on the package substrate and the chip encapsulates at least the bonding pads, the contacts and the bonding wires. The molding compound exposes the active region.

In an embodiment of the invention, the buffer groove exposes the surface of the chip for example.

In an embodiment of the invention, the buffer groove exposes the surface of the chip for example. Furthermore, a hole is formed on the surface of the chip corresponding to the buffer groove.

In an embodiment of the invention, the molding compound further encapsulates a portion of the flash-resisting ring.

In an embodiment of the invention, the material of the flash-resisting ring includes metal.

In an embodiment of the invention, the chip is a charge coupled device (CCD), a complementary metal oxide semiconductor (CMOS) image sensor, a finger print sensor or a photo diode.

According to the present invention, a package process of a chip package including following steps is provided. First, a package substrate is provided. The package substrate includes a carrying surface and several contacts disposed on the carrying surface. Next, a chip is disposed on the carrying surface. A surface of the chip away from the package substrate includes an active region and several bonding pads. The bonding pads are located outside the active region. Afterwards, a flash-resisting ring located between the bonding pads and the active region is formed on the surface of the chip. The flash-resisting ring surrounds the active region. Later, at least a buffer groove is formed on the flash-resisting ring. The buffer ring surrounds the active region. Subsequently, a wire-bonding process is performed to connect the bonding pads and the corresponding contacts through several bonding wires. Thereon, a mold assembly including a first mold and a second mold is provided. The first mold carries the package substrate. The second mold pressing over the flash-resisting ring covers the active region. A cave is formed by the first mold and the second mold outside the chip. The bonding wires, the contacts and the bonding pads are located in the cave. The buffer groove is located outside the cave. After, a molding compound is formed in the cave to encapsulate the bonding pads, the contacts and the bonding wires. Then, the mold assembly is removed to expose the active region.

In an embodiment of the invention, the buffer groove is formed on the flash-resisting ring by an etching process or laser drilling.

In an embodiment of the invention, the package process further includes a step of forming a hole on the surface of the chip corresponding to the buffer groove. The buffer groove exposes the hole.

In an embodiment of the invention, the package process further includes a step of forming a hole on the surface of the chip corresponding to the buffer groove. The buffer groove exposes the hole. Furthermore, the hole is formed before the flash-resisting ring is formed.

In an embodiment of the invention, the package process further includes a step of forming a hole on the surface of the chip corresponding to the buffer groove. The buffer groove exposes the hole. Furthermore, the hole and the buffer groove are formed at the same time.

Based on the above description, the buffer groove is formed on the flash-resisting ring of the invention. Preferably, the hole is formed on the surface of the chip corresponding to the buffer groove. As a result, the buffer groove preferably along with the hole contains the overflowing molding compound when the molding process is performed. Therefore, the active region of the chip is protected from flash.

The invention will become apparent from the following detailed description of the preferred but non-limiting embodiments. The following description is made with reference to the accompanying drawings.

DETAILED DESCRIPTION OF THE INVENTION

First Embodiment

Figure 1A:
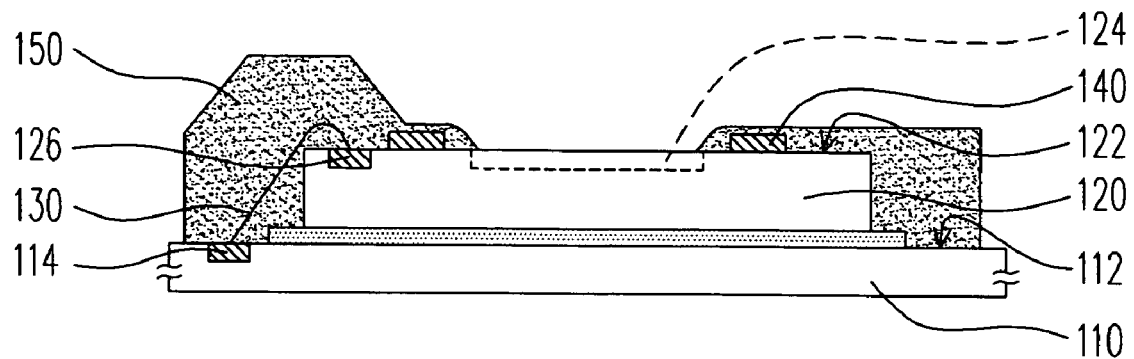
FIG. 1A (PriorArt) is a cross-sectional view of a conventional chip package in an electro-optical device.
Figure 1B:
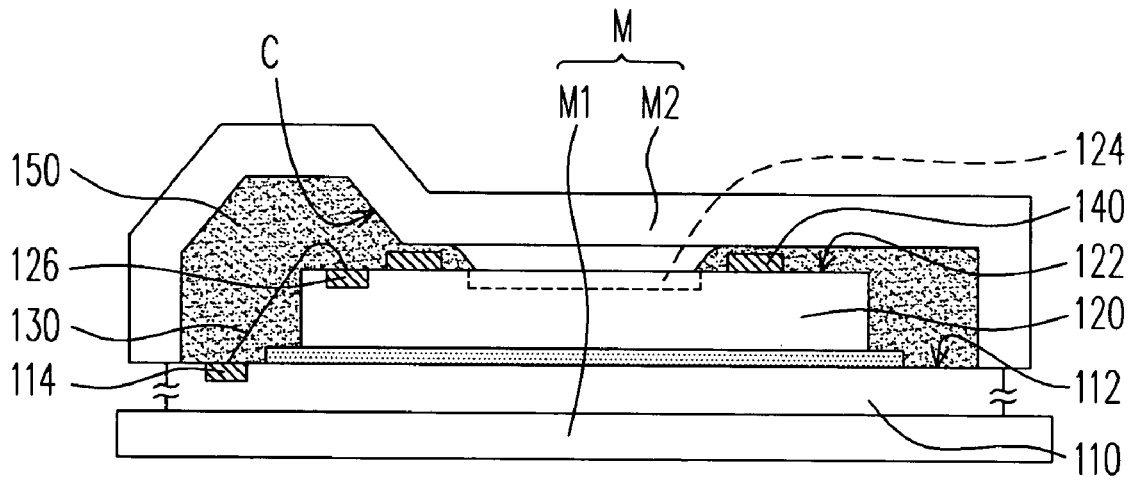
FIG. 1B (Prior Art) illustrates the chip package in FIG. 1A in an molding process
Figure 2:
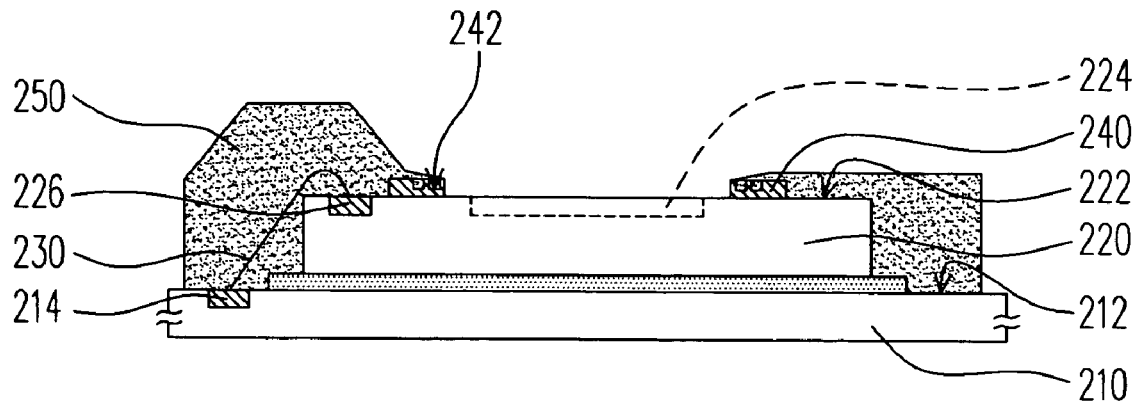
FIG. 2 is a cross-sectional view of a chip package according to a first embodiment of the invention.

Please referring to FIG. 2, FIG. 2 is a cross-sectional view of a chip package according to a first embodiment of the invention. A chip package 200 of the first embodiment includes a package substrate 210, a chip 220, several bonding wires 230, a flash-resisting ring 240 and a molding compound 250. The package substrate 210 includes a carrying surface 212 and several contacts 214 disposed on the carrying surface 212. The chip 220 is disposed on the carrying surface 212. The chip 220 has a surface 222 away from the package substrate 210. The surface 222 includes an active region 224 and several bonding pads 226 outside the active region 224. The bonding wires 230 connect the bonding pads 226 and the contacts 214.

In the first embodiment of the invention, the chip 220 is an image sensor applied to a digital camera or digital video camera for example. The chip 220 can be a charge coupled device (CCD), a complementary metal oxide semiconductor (CMOS) image sensor, a finger print sensor or a photo diode. The chip 220 is used for receiving an outer optical signal (through the active region 224 to capture an outer image), so that the optical signal is converted into an electrical signal to be processed. Furthermore, the bonding pads 226, the bonding wires 230 and the contacts 214 are preferably arranged on one side of the chip 220 or the package substrate 210. Or, the bonding pads 226, the bonding wires 230 and the contacts 214 are arranged around the chip 220 or the package substrate 210. The arrangement is not shown in drawings.

The flash-resisting ring 240 is disposed on the chip 220. The flash-resisting ring 240 located between the bonding pads 226 and the active region 224 surrounds the active region 224. At least one buffer groove 242 (two buffer grooves illustrated in FIG. 2 for example) around the active region 224 is formed on the flash-resisting ring 240. In the first embodiment of the invention, the buffer groove 242 does not reach the surface 222 of the chip 220. The material of the flash-resisting ring 240 includes metal. Besides, the buffer groove 242 of the flash-resisting ring 240 is used for prevent the molding compound 250 from overflowing into the active region 224 (more details describes as follow). As a result, the active region 224 of the chip 220 is not polluted by flash.

The molding compound 250 is disposed on the package substrate 210 and the chip 220. The molding compound 250 exposing the active region 224 encapsulates at least the bonding pads 226, the contacts 214 and the bonding wires 230. In the first embodiment of the invention, the molding compound 250 further encapsulates a portion of the flash-resisting ring 240 for example. Moreover, the molding compound 250 is used for protecting the bonding wires 230 from moisture, heat and noise. The molding compound 250 supports the bonding wires 230 and provides a hand-holding shape.

Figure 3A:
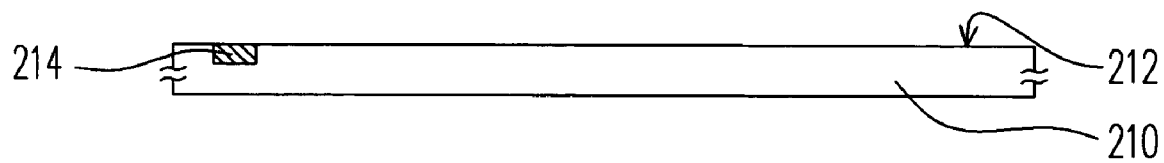
FIGS. 3A~3H are cross-sectional views of the package process of the chip package in FIG. 2.
Figure 3B:
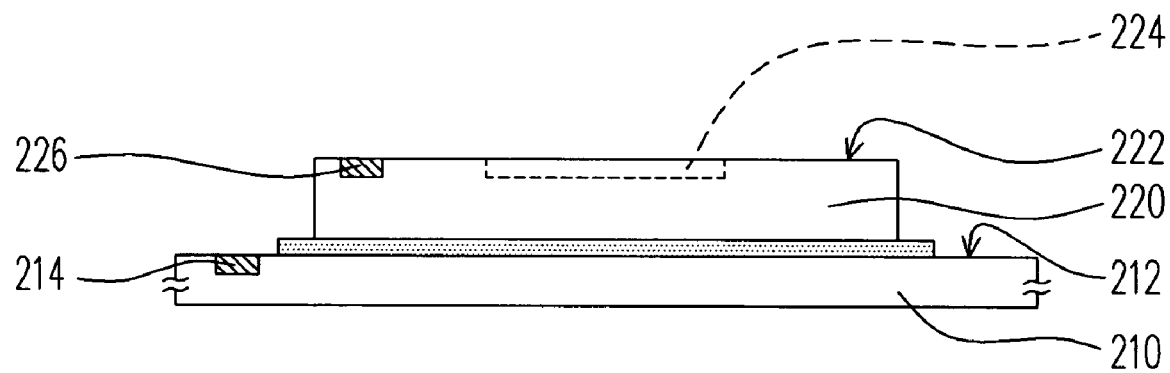

A package process of a chip package according to the first embodiment of the invention is illustrated as follow. FIGS. 3A~3H are cross-sectional views of the package process of the chip package in FIG. 2. The package process of the chip package according to the first embodiment of the invention includes following steps. First, as shown in FIG. 3A, a package substrate 210 is provided. The package substrate 210 includes a carrying surface 212 and several contacts 214 disposed on the carrying surface 212. Next, as shown in FIG. 3B, a chip 220 is disposed on the carrying surface 212. The chip 220 has a surface 222 away from the package substrate 210. The surface 222 includes an active region 224 and several bonding pads 226 disposed outside the active region 224.

Figure 3C:
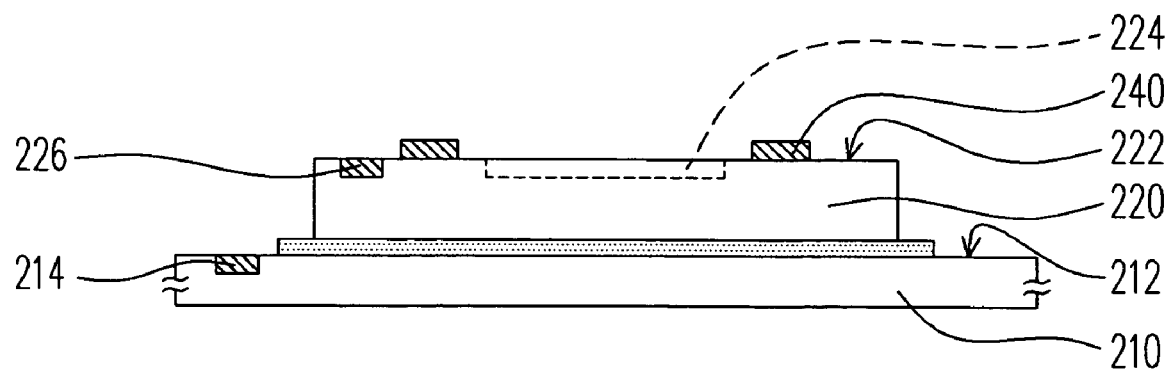
Figure 3D:
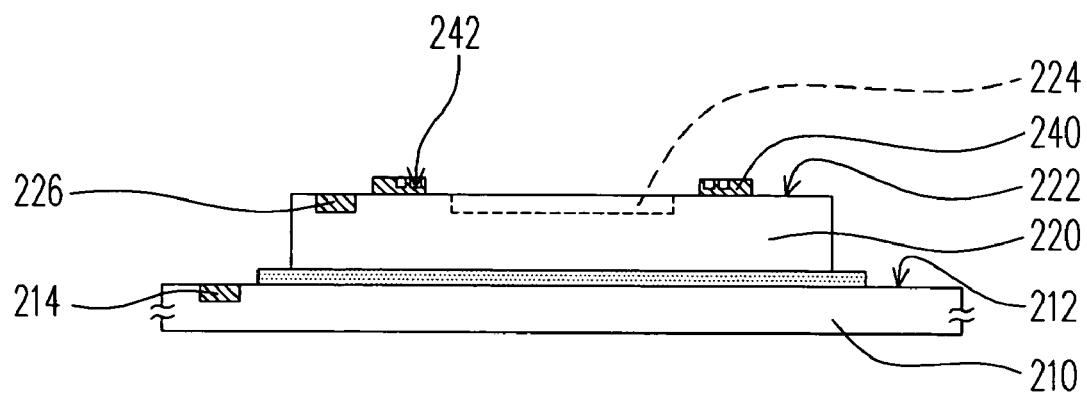
Figure 3E:
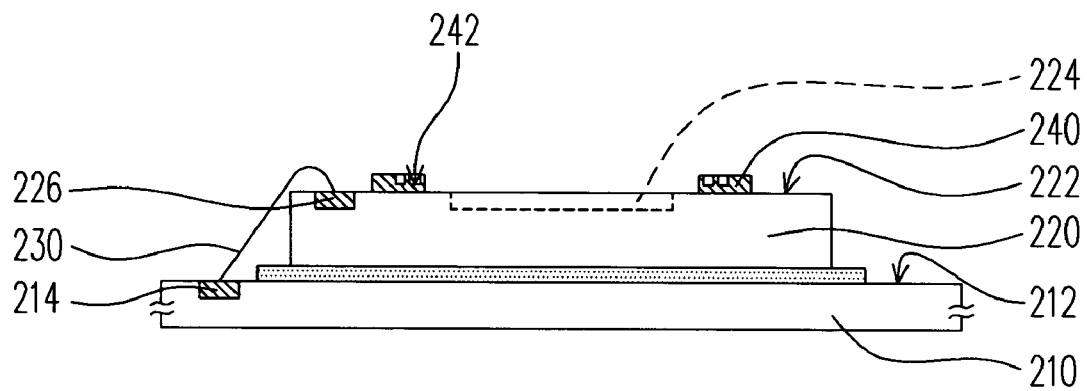

Afterwards, as shown in FIG. 3C, a flash-resisting ring 240 is formed on the surface 222 of the chip 220. The flash-resisting ring 240 located between the bonding pads 226 and the active region 224 surrounds the active region 224. Subsequently, as shown in FIG. 3D, at least a buffer groove 242 (two buffer grooves illustrated in FIG. 3D) is formed on the flash-resisting ring 240. The buffer groove 242 surrounds the active region 224. The buffer groove 242 is formed through an etching process or laser drilling. Moreover, as shown in FIG. 3E, a wire bonding process is performed. The bonding pads 226 and the corresponding contacts 214 are connected together through the bonding wires 230.

Figure 3F:
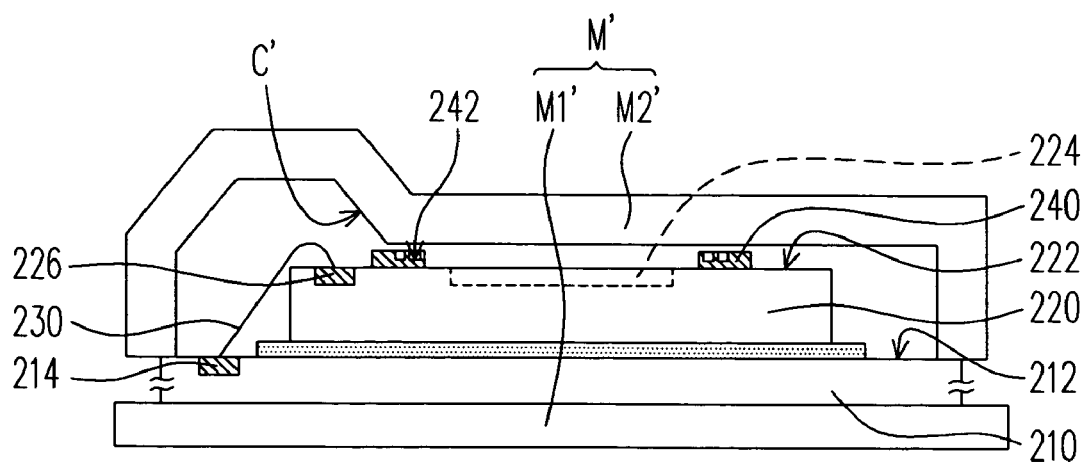

Thereon, as shown in FIG. 3F, a mold assembly M' including a first mold M1' and a second mold M2' is provided. The first mold M1' carries the package substrate 210. The second mold M2' pressing over the flash-resisting ring 240 covers the active region 224. As shown in FIG. 3F, the second mold M2' does not contact the active region 224, so that the components (not shown in drawings) in the active regions 224 are not pressed and damaged. The first mold M1' and the second mold M2' form a cave C' outside the chip 220. The bonding wires 230, the contacts 214 and the bonding pads 226 are located in the cave C'. The buffer groove 242 is located outside the cave C'.

Figure 3G:
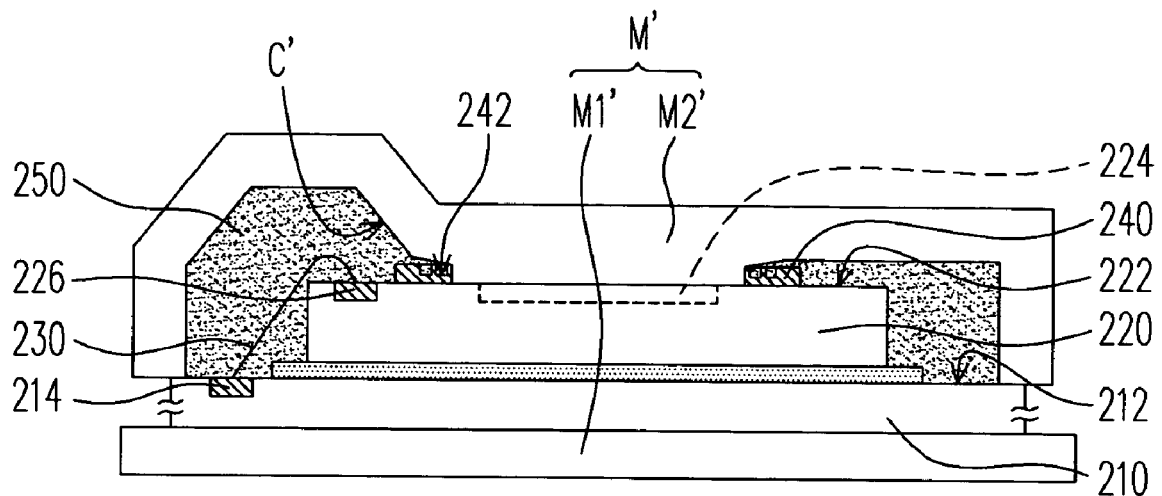
Figure 3H:
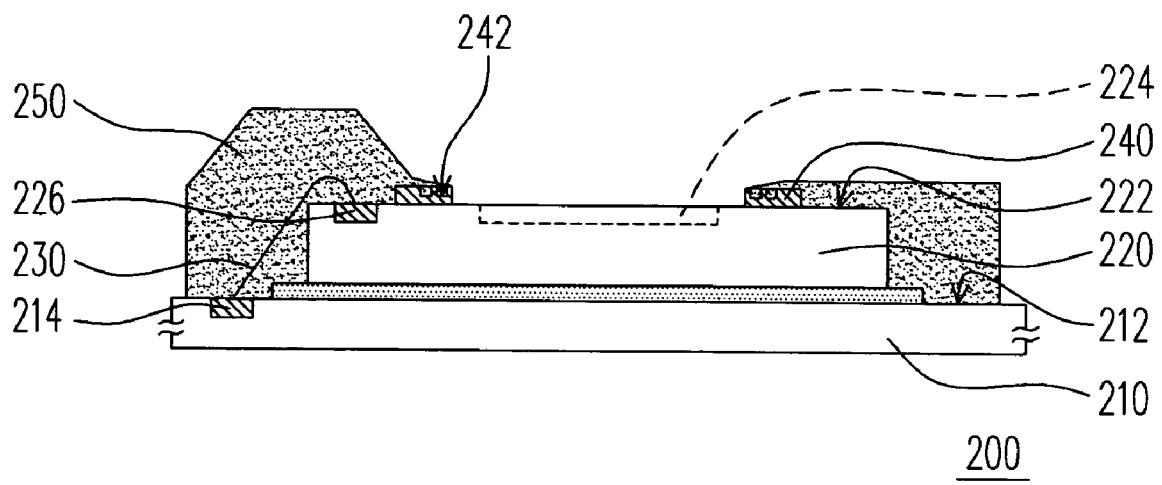

Later, as shown in FIG. 3G, a molding process is performed to form a molding compound 250 in the cave C'. The molding compound 250 encapsulates the bonding pads 226, the contacts 214 and the bonding wires 230. What is worth mentioning is that the second mold M2' is not contoured to fit the flash-resisting ring 240, and the molding compound 250 is in the molten state when filled into the cave C'. As a result, the melted molding compound 250 usually overflows into the gap between the second mold M2' and the flash-resisting ring 240. Because the flash-resisting ring 240 has the buffer groove 242, the buffer groove 242 contains the overflowing molding compound 250. Accordingly, the active region 224 of the chip 220 is not polluted by the overflowing molding compound 250. In other words, the molding compound 250 further encapsulates a portion of the flash-resisting ring 240. Thereon, as shown in FIGS. 3G~3H, the mold assembly M' is removed to exposed the active region 224. The chip package 220 in FIG. 2 is accomplished.

Second Embodiment

Figure 4:
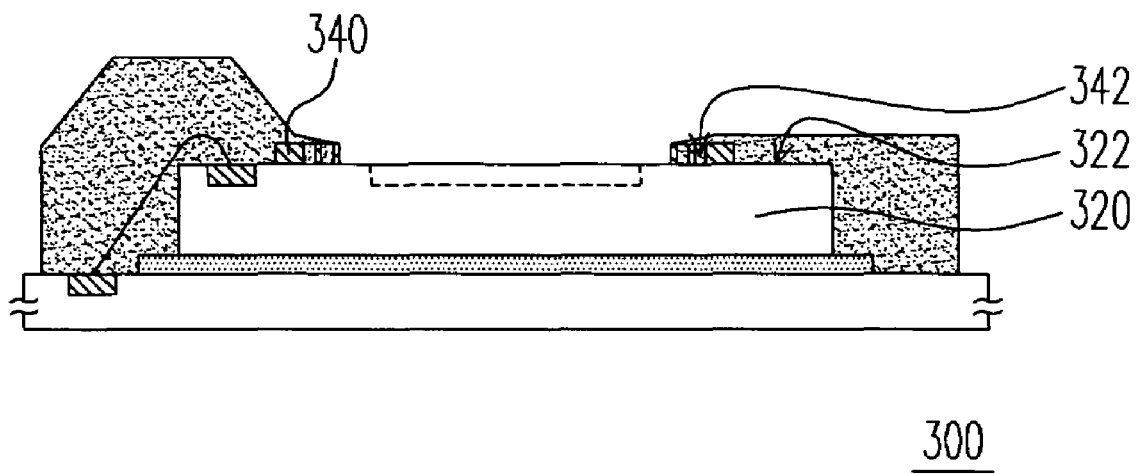
FIG. 4 is a cross-sectional view of a chip package according to a second embodiment of the invention.

FIG. 4 is a cross-sectional view of a chip package according to a second embodiment of the invention. Please referring to FIG. 2 and FIG. 4, the difference between the chip package 300 in the second embodiment and the chip package 200 in the first embodiment is that the buffer groove 342 of the flash-resisting ring 340 in the second embodiment exposes the surface 322 of the chip 320. In other words, the buffer groove 342 reaches the surface 322 of the chip 320, so that the buffer grieve 342 has larger containing space. Furthermore, the function and forming steps of the buffer groove 342 are the same as those in the first embodiment and not described repeatedly.

Third Embodiment

Figure 5:
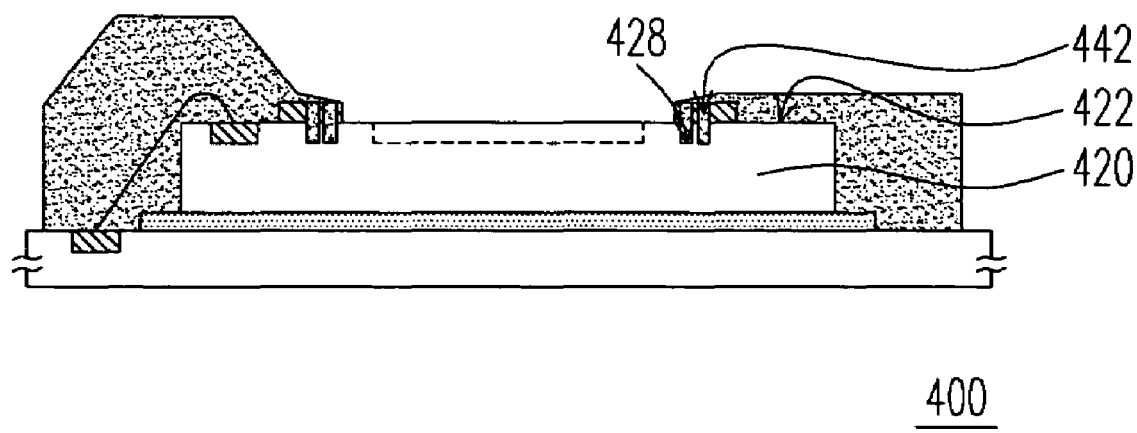
FIG. 5 is a cross-sectional view of a chip package according to a third embodiment of the invention.

FIG. 5 is a cross-sectional view of a chip package according to a third embodiment of the invention. Please referring to FIG. 4 and FIG. 5, the difference between the chip package 400 of the third embodiment and the chip package 300 of the second embodiment is that several holes 428 (the number of the holes 428 is usually the same as that of the buffer grooves 422) are formed on the surface 422 of the chip 420 in the third embodiment. The buffer grooves 422 expose the holes 428, so that the total space of the buffer grooves 422 and the holes 428 is larger.

Figure 6A:
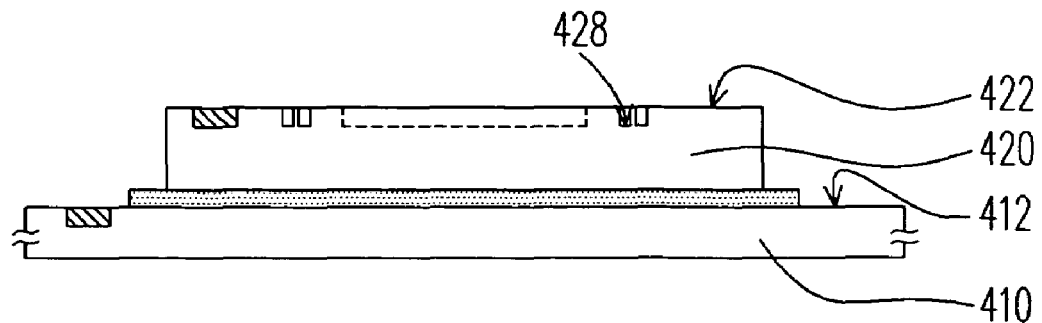
FIGS. 6A~6C illustrate steps of forming a hole in the chip package in FIG. 5.
Figure 6B:
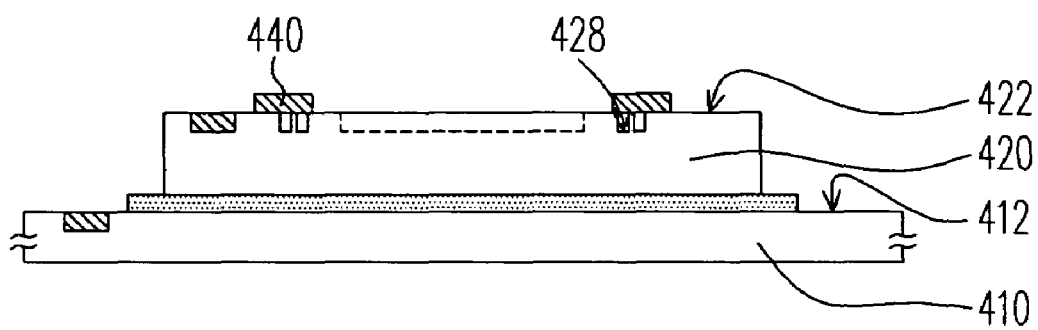
Figure 6C:
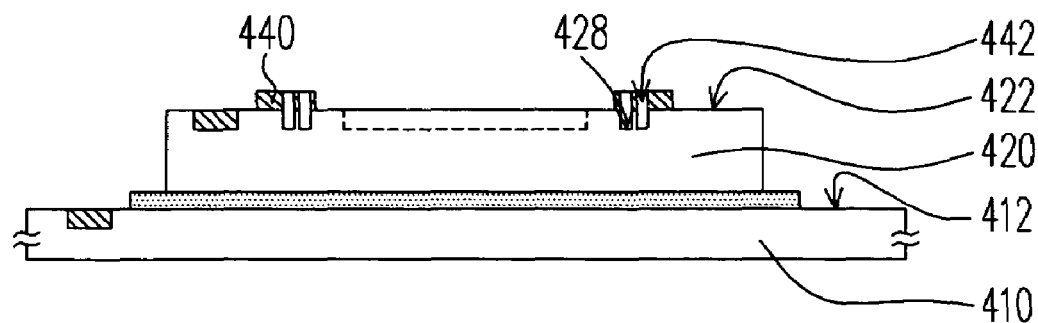

Moreover, the package process of the chip package in the third embodiment is different from that of the first embodiment. FIGS. 6A~6C shows steps of forming the holes of the chip package. Please referring to FIG. 6A and FIG. 3B, after the step in FIG. 3B, that is, after the step of disposing the chip 420 on the carrying surface 412 of the package substrate surface 422 of the chip 420. Then, as shown in FIG. 6C, several buffer grooves 442 exposing the corresponding holes 428 are formed on the flash-resisting ring 440. The buffer grooves 442 are formed by an etching process or laser drilling. The buffer grooves 442 and the corresponding holes 428 form a containing space together. Following steps are the same as those of the first embodiment in FIGS. 3E~3H and not described repeatedly.

What is worth mentioning is that the steps of forming the holes 428 are not limited to be after the step of disposing the chip 420 on the carrying surface 412 of the package substrate 410 in FIG. 6A. The holes 428 can be formed before a wafer (not shown in drawings) is separated into several chips 420. (In other words, the holes 428 only need to be formed before the flash-resisting ring 440 is formed.) Or, the holes 428 and the buffer grooves 442 are formed at the same time (not shown in drawings). The step of forming the holes in the third embodiment is only an example. The invention is not limited thereto.

As stated above, the chip package and the package process of the invention include following advantages.

First, the buffer groove is formed on the flash-resisting ring. As a result, the buffer groove contains the overflowing molding compound when the molding process is performed. Therefore, the active region of the chip is protected from flash pollution.

Second, the buffer groove is formed on the flash-resisting ring, and the corresponding holes are formed on the surface of the chip. As a result, the buffer groove and the corresponding hole together contain the overflowing molding compound. Therefore, the active region of the chip is protected from flash pollution.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip package comprising:
   a package substrate comprising a carrying surface and a plurality of contacts disposed on the carrying surface;
   a chip disposed on the carrying surface, a surface of the chip away from the package substrate comprising an active region and a plurality of bonding pads located outside the active region;
   a plurality of bonding wires connecting the bonding pads and the contacts;
   a flash-resisting ring disposed on the chip, the flash-resisting ring located between the bonding pads and the active region, the flash-resisting ring surrounding the active region, at least a buffer groove formed on the flash-resisting ring, the buffer groove surrounding the active region; and
   a molding compound disposed on the package substrate and the chip, the molding compound encapsulating at least the bonding pads, the contacts and the bonding wires, the molding compound exposing the active region.

2. The chip package according to claim 1, wherein the buffer groove exposes the surface of the chip.

3. The chip package according to claim 2, wherein a hole is formed on the surface of the chip correspondingly to the buffer groove.

4. The chip package according to claim 1, wherein the molding compound further encapsulates a portion of the flash-resisting ring.

5. The chip package according to claim 1, wherein the material of the flash-resisting ring comprises metal.

6. The chip package according to claim 1, wherein the chip is a charge coupled device (CCD), a complementary metal oxide semiconductor (CMOS) image sensor, a finger print sensor or a photo diode.

* * * * *